(12) United States Patent
Engelhardt et al.

(10) Patent No.: US 7,570,245 B2
(45) Date of Patent: Aug. 4, 2009

(54) CONTROL UNIT AND METHOD FOR REDUCING INTERFERENCE PATTERNS IN THE DISPLAY OF AN IMAGE ON A SCREEN

(75) Inventors: Oliver Engelhardt, Dachau (DE); Andreas Eckhardt, München (DE)

(73) Assignee: NXP B.V., Eindhoven (NL)

( * ) Notice: Subject to any disclaimer, the term of this patent is extended or adjusted under 35 U.S.C. 154(b) by 483 days.

(21) Appl. No.: 11/071,537

(22) Filed: Mar. 3, 2005

(65) Prior Publication Data
US 2005/0212793 A1 Sep. 29, 2005

Related U.S. Application Data

(63) Continuation of application No. PCT/EP03/09633, filed on Aug. 29, 2003.

(30) Foreign Application Priority Data
Sep. 6, 2002 (DE) .............................. 102 41 343

(51) Int. Cl.
G09G 3/36 (2006.01)
G09G 5/00 (2006.01)
G09G 3/38 (2006.01)

(52) U.S. Cl. .................. 345/100; 345/212; 345/213

(58) Field of Classification Search .............. 345/3.2, 345/204, 208, 213, 98–100; 348/540–547
See application file for complete search history.

(56) References Cited

U.S. PATENT DOCUMENTS 5,335,023 A * 8/1994 Edwards ............ 345/100
5,585,816 A * 12/1996 Scheffer et al. .......... 345/100
5,757,338 A 5/1998 Bassetti et al.
5,943,382 A 8/1999 Li et al.
6,046,735 A * 4/2000 Bassetti et al. ............ 345/204
6,433,766 B1 8/2002 Chen
6,665,019 B1 * 12/2003 Pronkine ................ 348/540
6,720,943 B1 4/2004 Lee et al.
6,762,784 B2 * 7/2004 Skillman .................. 347/255
7,190,360 B1 * 3/2007 Hiroki ..................... 345/99
2002/0060672 A1 5/2002 Shin et al.

FOREIGN PATENT DOCUMENTS

| DE | 199 54 240 A1 | 10/2000 |
|---|---|---|
| DE | 100 53 204 A1 | 5/2001 |
| EP | 0 704 833 A2 | 4/1996 |
| JP | 63071889 A | 4/1988 |
| JP | 10149136 A | 6/1998 |
| JP | 11133906 A | 5/1999 |
| JP | 2000347218 A | 12/2000 |
| JP | 2001125542 A | 5/2001 |

OTHER PUBLICATIONS

Japan Office Action received on Jan. 29, 2009; Patent Application No. 2004-533428; JPO Examiner, Ryoji Goto.

* cited by examiner

Primary Examiner—David L Lewis

(57) ABSTRACT

A control unit and a method are provided to reduce an interference pattern in the display of an image on a screen with a pixel frequency. The image is described by pixel data and provided to the screen by a control unit. During the generation of pixel data, the clock signals used in the generation of the pixel data are varied or the pixel frequency is changed.

12 Claims, 11 Drawing Sheets

A)

B)

CONTROL UNIT AND METHOD FOR REDUCING INTERFERENCE PATTERNS IN THE DISPLAY OF AN IMAGE ON A SCREEN

CROSS-REFERENCE TO RELATED APPLICATION

This application is a continuation of and claims priority to co-pending International Application No. PCT/EP03/09633, filed Aug. 29, 2003, which designated the United States, which claimed priority to German Patent Application No. 102 41 343.6, filed on Sep. 6, 2002, and which is incorporated herein by reference in its entirety.

BACKGROUND OF THE INVENTION

1. Field of the Invention

The present invention relates to a control unit and a method for controlling a screen, and here particularly to a control unit and a method for reducing interference patterns in a display of an image on the screen. Particularly, the present invention relates to a method and a control unit for usage with a TFT/LCD screen.

2. Description of the Related Art

Complex systems, which use a plurality of signal, show increasing interactions between digital and analog components with increasing decrease of pattern size. This fact is serious in systems which unite several clock signals (clock domains) on one chip, and which use similar frequencies for digital data processing and analog data acquisition.

Particularly in graphic applications, such interactions show in the form of interference patterns in the output image, which will be discussed below in more detail with regard to a TFT/LSD screen (TFT=Thin Film Transistor; LCD=Liquid Crystal Display).

For connecting TFT/LCD screens to common image sources (such as to PC graphic cards: VGA, DVI and parallel ports (PC=Personal Computer; VGA=Video Graphics Adapter; DVI=Digital Video Input)), LCD control units are required, which acquire different input data, transfer them to digital RGB data (RGB=Red, Green, Blue) and output them with the waveform (pixel frequency) required by the respective screen type.

FIG. 8 shows a simplified block diagram of a conventional LCD control chip 800. The control chip 800 receives input signals from different input sources 802, 804, and 806. This is the schematically illustrated signal source 802, which provides analog video input signals (AVI=Analog Video Input). The signal source 804 provides digital video input signals (DVI=Digital Video Input). The signal source 806 provides parallel video input signals (PVI=Parallel Video Input). The input signals provided to the control chip 800 by the input sources 802 to 806 are applied to an input selection unit 808, which selects the input signals to be processed and provides them to an input 810 of the control chip 800. The signals provided at input 810 are provided to a processing unit 812, which comprises a FIFO memory (FIFO=First In First Out) and a memory element. The memory associated to the processing means 812 is connected to a memory interface 814 (MI=Memory Interface). The processing unit 812 outputs the pixel data to be displayed on the screen with a pixel frequency ppll_clk to the screen, via an output 814 and the output interface 816. The control chip 800 further comprises a configuration block 818, which is driven with a system clock sys_clk.

At the processing unit 812, the signals are applied with the clock fclk, which corresponds to the clock of input signals acquired from the input sources 802 to 806 (DV1_clk, AVI_clk, PVI_clk).

As it is illustrated in FIG. 8, apart from the different clocks (clock domains) of the input sources (AVI_clk, DV1_clk, PVI_clk) further clocks (domains) for the memory interface 814 (mpll_clk) and the screen interface 818 (ppll_clk) are provided on the control chip 800, depending on the type of control unit. Further, the system clock sys_clk is provided.

The control chip 800 shown in FIG. 8, for example, is disposed on a printed circuit board, and receives, for example, the video or graphic signals provided by a computer for rendition and display on the screen.

It is the problem of such control units that the clock signal couple into one or several inputs of the control chip via the substrate of the control chip 800 and overlay the applied signals. Thereby, interfering interference patterns are generated in the display of the data on the screen. This problem will be illustrated below with regard to the signals received at the analog input.

With regard to the different inputs of the control chip 800, it should be noted, that, theoretically, the DVI input 804 can be interfered with by the other clock signals (clock domains) via the substrate of the chip, but, for simplicity reasons, the following description is limited to the analog input 802 (AVI) as interference sink, wherein the memory and screen clock signals mpll_clk and ppll_clk are considered as interference source, which couple into the analog input AVI via the substrate of the control chip 800, which normally has a low impedance.

The simplest case of an interference in LSCD control units, which occurs often in practice, is coupling-in of an interference signal into the analog video input 802 (AVI) with the frequency of the screen clock ppll_clk (pixel frequency) and the higher harmonics of this clock, respectively. There are several possibilities how the interference signal is generated and how it gets into the low impedance substrate of the chip 800. Apart from the digital logic in the core, the input/output driver of the output interface 818 can be seen as main source for the substrates voltages.

With regard to FIG. 9, an equivalent circuit diagram of the screen interface or output interface 818 of FIG. 8 is shown. In the left portion of FIG. 9 (left of the broken line) elements of the memory chip are illustrated, and on the right side of the broken line, elements of the circuit board are illustrated.

The interface receives the pixel signals to be displayed on the screen at the driver stage 822 from output 816 with the pixel frequency of the screen ppll_clk. In the illustrated example, the driver stage 822 comprises a first field effect transistor 822a as well as a second field effect transistor 822b. The output of the driver stage 822 is connected to a pad of the control chip 800, wherein the pad has an impedance with an ohmic portion and a capacitive portion against the substrate ground, which is illustrated in FIG. 9 by the resistor $R_1$ and the capacity $C_1$. The control chip 800 is connected to a housing via a bond wire, to connect a pad of the control chip to a pad of the chip housing. In FIG. 9, the inductive portion $L_1$ and the ohmic portion $R_2$ of the impedance of the bond wire are shown.

Additionally, the capacitive, inductive and ohmic portions of the impedances of the pad and the housing with which the control chip is connected via the bonding wire, are shown as resistor $R_3$, as inductance $L_2$ as well as as capacities $C_2$ and $C_3$.

A transmission line TL is provided on the circuit board, which outputs the signal output from the control chip to another driver stage, which again passes the signal on to the screen. Similar to the driver stage 822, the driver stage 824 comprises a first field effect transistor 824a and a second field effect transistor 824b. Further, with the capacity $C_4$, a capacity of the housing of the driver stage 824 is illustrated.

Further, in FIG. 9 the voltage $u_L(t)$ is illustrated in relation to the inductance $L_1$, which drops across it. As discussed above, one of the main sources for the substrate voltages are the output signals of the input/output driver stage 822 of the screen interface. This interface generates very steep signals (high di/dt) across the inductances $L_1$, $L_2$ and resistors $R_1$, $R_2$, $R_3$ of the bond wires and the pads. This leads to the fact that voltages of up to several 100 mV ($u_L(t)$) can drop over the bond wires, which are coupled directly or indirectly into the substrate of the control chip 800 caused by the driver layout.

Another source for interferences at the analog input of the control chip 800 can be mass or supply voltage interferences (bounces), which can arise by a low or missing decoupling on the control chip in the digital core or by an insufficient guidance of the lines supplying the supply voltage (power routing).

The visible effects are very similar in both cases, and with insufficient immunity of the analog circuits (power supply ripple rejection, ground and substrate noise decoupling), these are visible in the form of high frequency quasi noise signals (with high interference frequency $f_{interf} \approx avi\_clk$, in the form of narrow diagonal stripes and lines ($\frac{1}{2} avi\_clk \geq f_{interf} \geq f_{horizontal}$) or in the form of low frequency, horizontally aligned stripes ($f_{horizontal} \geq f_{interf} \geq f_{vertical}$) with lower or higher brightness.

The appearance of the interference visible on the screen (panel) depends on the frequencies set on the control chip 800 in relation to the input clock, wherein the respective input format (active area, blanking, etc.) plays an important part.

In FIG. 10A, an example for such an interference pattern is illustrated, which has been simulated for a LCD control unit with a screen interface based on a C model. The waveform of the interference pattern illustrated in FIG. 10a corresponds mostly to the waveform to be observed in a real LCD control unit.

So far, merely LCD control units with one screen interface have been considered. Additionally, there exist LCD control units, such as the one described with reference to FIG. 8, where the memory interface 814 is also provided. In principle, the same considerations apply as above, but in LCD control units with external memory, apart from the screen interface, significantly stronger driver inputs/outputs for the memory interface exist on the control chip 800. These stronger drivers provided for the memory interface are significant for the consideration, not least due to their effect on the substrate. Normally, the data across the memory interface are clocked with a different, normally higher clock than in the screen interface. Like in the screen interface, inductive voltages are generated across the bond wires by the very steep signals (high di/dt), which are coupled into the substrate and can influence the analog circuits from there. In reality, thus, there is a frequency mixture of at least two frequencies on the substrate, which are about in the same range as the input frequency avi_clk of the signal of the considered input source 802.

If both frequencies are considered independently, a superposition of two interference patterns, as it is shown in FIG. 10B, becomes possible. Here, merely the base frequencies and not the harmonic frequency portions are considered, which themselves would lead to a differing interference pattern.

In the following, the formation of the interference patterns discussed above with regard to FIGS. 10A and 10B, will be considered in more detail. In the formation of the interference pattern, the simplified mechanism described below is taken as a basis. Starting from a real XGA input mode (XGA=Extended Graphics Adapter), the resulting interference pattern is derived computationally and illustrated graphically by considering the set pixel frequency (only the base frequency). For the following consideration, the following conditions are assumed:

Input Mode:

| XGA 1024 × 768 at 75 Hz at 78.75 MHz | |
|---|---|
| Horizontal Back Porch | :176 Pixel |
| Horizontal Front Porch | :112 Pixel |
| Vertical Back Porch | :28 lines |
| Vertical Front Porch | :4 lines |

Screen Setting:

| XGA 1024 × 768 | |
|---|---|
| Pixel frequency | :66 MHz |

Therefrom, the interference frequency $f_{interf}$ is calculated first to:

$$f_{interf} = 78.75 \text{ MHz} - 66 \text{ MHz} = 12.75 \text{ MHz}.$$

Therefrom, the number of interferences can be calculated per input line at the analog video input (active area+blanking), which results to:

$$\text{interf/line} = (78.75/12.75)^{-1} * 1312 = 212.4190$$

Thus, a maximum/minimum of the interference occurs periodically with a distance of:

$$I_{interf} = 1312/212.4190 \ldots = 6.1764 \ldots \text{ pixel}$$

and $$t_{interf} = (78.75 \text{ MHz})^{-1} * 6.1764 \ldots = 78.4313 \ldots \text{ ns},$$
respectively.

If it is assumed that in the first frame (frame; f=1), first line (n=1), the starting point t=0s is selected, then the first minimum/maximum of the interference is visible between the sixth and seventh pixel and after 78.4313 ns, respectively, and from there on, periodically (with $t_{interf}$) until the end of the line. Since the interference period normally does not fit into an input line as an integer, a remainder is left at the end of each line. The difference of (interf/line)*n to the next integer is then the respective starting value for the following line n+1. By this shift of the respective starting value with each line, a diagonal line pattern is formed, wherein the following applies:

remainder{interf/line}<0,5→diagonal stripes \\\\\\ remainder{interf/line}>0,5→diagonal stripes ///////

The value after the decimal point of (interf/line)*$n_{max}$ accumulating in the last line determines the starting value of the interference in the subsequent frame (f+1), wherein in most cases, an upwards or downwards shift of the diagonal lines occurs. The result is, depending on the vertical frequency of the screen, moving diagonal lines, which travel across the original image in one direction. In fixed frequency ratios, the apparent speed in the direction of this movement is constant and depends merely on the interference frequency and the waveform of the input signal at the analog video input.

The above stated explanations, which have led to the interference pattern, are summarized again graphically with reference to FIG. 11. Particularly, the fixing of the starting values is illustrated for the subsequent lines and subsequent frames.

In reality, the mechanism of the interference formation is more complex, since additionally not only all harmonic frequency portions, but also the dynamic behavior of all components on the control chip, as well as the external elements, such as the phase locked loops on the control chip, the input signal sources etc., play an important part, but in principal, however, the resulting interferences can be calculated here as well.

The correlated interference patterns on the screen generated due to the above-described mechanisms are visible for a user/viewer and thus interfering.

SUMMARY OF THE INVENTION

It is therefore the object of the present invention to provide a method and a control unit, which avoids the visible interferences on a screen.

In accordance with a first aspect, the present invention provides method for reducing interference patterns in the display of an image on a screen with a pixel frequency, wherein the image can be described by pixel data, which are provided to the screen by a control unit based on received image data, wherein the control unit has an input for receiving the image data and a plurality of clock signals, wherein one or more of the clock signals couples into the control unit via the input and overlays the image data, the method having the step of: during the generation of pixel data, varying one or several of the clock signals used in generating the pixel data by time-dependent frequency modulation, wherein the time-dependent frequency modulation is time-discrete over a row or a frame of the pixel data, and the frequency is changed in a change of rows or a change of frames.

In accordance with a second aspect, the present invention provides control unit for controlling a screen, which operates at a pixel frequency, for the display of an image on the screen with reduced interference pattern, wherein the control unit has a plurality of clock signals, having an input for receiving image data, wherein one or more of the clock signals couples into the control unit via the input and is overlaid with the image data; a processor, which processes the received image data for generating the pixel data, wherein the processor varies one or several of the clock signals used in generating the pixel data during the generation of the pixel data by time-dependent frequency modulation; and an output for providing the pixel data for the display, wherein the time-dependent frequency modulation is time-discrete over a row or a frame of the pixel data, and wherein the processor causes a change of the frequency in a change of rows or a change of frames.

The present invention provides a method for reducing interference patterns in the display of an image on a screen with a pixel frequency, wherein the image can be described by pixel data, which are provided to the screen by a control unit, wherein during the generation of the pixel data one or several of the clock signals used in generating the pixel data are varied.

According to one embodiment, the present invention provides a method for reducing interference patterns in the display of an image on a screen with a pixel frequency, wherein the image can be described by pixel data, which are provided to the screen by a control unit, wherein the pixel frequency is changed during the generation of the pixel data.

Further, the present invention provides a control unit for controlling a screen, which operates at a pixel frequency, for the display of an image on the screen with reduced interference pattern. The control unit comprises an input for receiving image data, a processing unit, which processes the received image data for generating the pixel data, wherein the processing means varies one or several clock signals used in the generation of the pixel data during the generation of the pixel data, and an output to provide pixel data for the display.

According to one embodiment, the present invention further provides a control unit for controlling a screen, which operates at a pixel frequency, for the display of an image on the screen with reduced interference pattern. The control unit comprises an input for receiving image data, a processing means, which processes the received image data for generating the pixel data, wherein the processing means changes the pixel frequency during the generation of pixel data, and an output to provide the pixel data for the display.

The inventive method and the inventive control unit cause a manipulation of the clock ratios on the control chip, whereby typical interference patterns are destroyed and thus made almost invisible.

The present invention is based on the knowledge that a rigid frequency ratio and a fixed input signal waveform are the cause for the formation of the interference patterns and the interference images, respectively. If avoiding the visible interferences is no longer possible by an appropriate design of the analog components alone, the frequency ratios on the chip are the starting point for solving the problems in connection with interference images.

Generally, the inventive approach can be seen in destroying the correlation and the rigid ratio of the used frequencies, respectively, so that no regular interference patterns can occur within a frame or within subsequent frames. According to a preferred embodiment, this destruction of the correlation and the rigid ratio of the frequencies, respectively, takes place by a time-dependent frequency modulation.

Hereby, the interferences, which are typically between one and five LSB (LSB=Least Significant Bit), are still present but for the human eye merely visible as slight irregular noise in the image and thus much less interfering.

According to a first embodiment, the time-dependent frequency modulation (FM) is realized by a time-continuous frequency modulation. According to another embodiment, a time-dependent frequency modulation is realized by a time-discrete frequency modulation.

According to a second preferred embodiment, the frequency modulation for a control chip is performed by an external frequency source, or, according to a further embodiment, by an internal frequency source realized on the chip.

According to a third preferred embodiment, the frequency modulation is performed by using spread spectrum phase locked loop(s).

BRIEF DESCRIPTION OF THE DRAWINGS

These and other objects and features of the present invention will become clear from the following description taken in conjunction with the accompanying drawing, in which.

DETAILED DESCRIPTION OF EXEMPLARY EMBODIMENTS

In the following description of the preferred embodiments, identical, seemingly identical or similar elements are provided with the same reference numbers in the figures.

Based on the above described simple model of interference formation, inventive approaches, methods and apparatuses are described below, by which the formation of visible and thus interfering interferences can be avoided or suppressed.

Here, it should be noted that the methods, approaches and apparatuses described below are to be seen additive to the measures which have to be taken in the concerned analog circuit parts and the total system (printed circuit board, chip, application), to reduce the sensitivity to noise and the unwanted substrate and mass voltages. Thus, the present invention preferably applies to systems that have already a fully developed and relatively interference insensitive analog operational behavior.

As has been mentioned above, according to a preferred embodiment of the present invention, the change in the pixel frequency for avoiding interference patterns is achieved by realizing a time-dependent frequency modulation FM, which destroys the correlation and the rigid ratio of the frequencies, respectively, so that when coupling-in the interfering frequencies, the interference patterns are reduced or suppressed.

According to a first embodiment, the time-dependent frequency modulation is realized by a time-continuous frequency modulation, such as by the function of a frequency wobbler, which passes a frequency area $\Box f$ with an appropriate rate, which is fixed by a modulation function g(t) around the base frequency ($f_0$) required by the screen and the memory, respectively.

Figure 1:
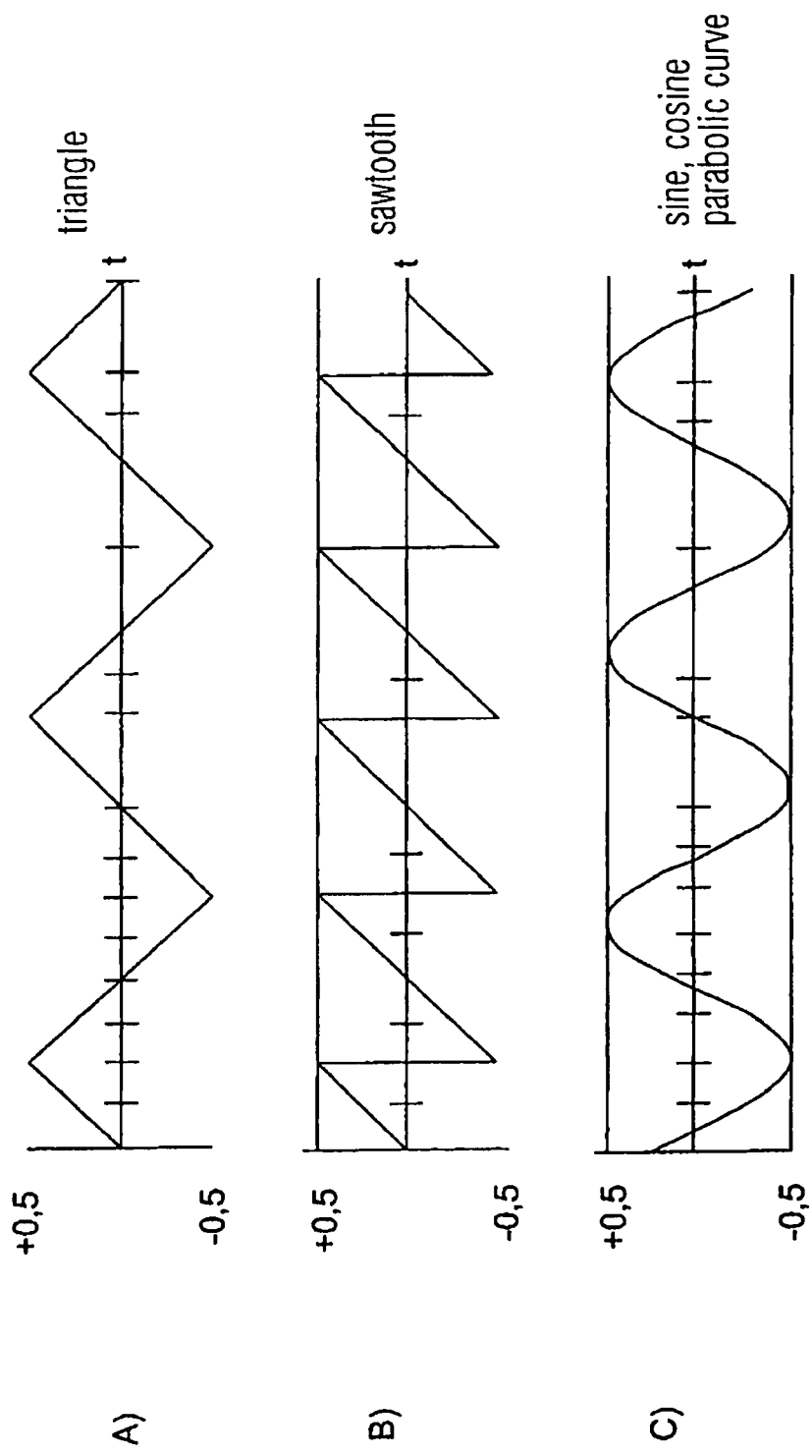
FIGS. 1A to C show examples for a time-continuous modulation function g(t)

Under the assumption that the required clock signals are generated on the control chip by phase locked loops (PLL), the following holds true for the input frequencies $f_{xpllin(t)}$ of the phase locked loops:

$$f_{xpllin(t)} = f_0 + \Box f * g(t)$$

with:

$f_0$=base frequency of the screen (pixel frequency) or base frequency of the memory $\Box f$=frequency range around the base frequency g(t)=modulation function The modulation function g(t) can be an arbitrary continuous function, such as the functions illustrated in FIG. 1A to 1C, wherein generally no restriction results with regard to the formation and the realization of the used function.

In the time continuous case of the frequency modulation described herein, the resulting pattern of the interference will change continuously within each line and thus within each individual frame, and when the function g(t) and the parameter $\Box f$ are determined appropriately, it is possible to generate a seemingly uncorrelated wide (quasi) noise from the originally correlated interference pattern.

In another preferred embodiment of the present invention, instead of the above described approach for the time continuous frequency modulation, which is generally quite expensive, a simpler, time-discrete frequency modulation is used, which leads to similar results, but offers significant advantages with regard to the realization.

In this embodiment, the frequency to be modulated $f_{xpllin(k)}$ does not change continuously, but, depending on implementation, by frame or by line. Further, an arbitrary timely determination can be selected. Like in the time-continuous frequency modulation, the frequency can change continuously or arbitrarily and erratic, via an appropriate random generator, which enables a more effective generation of "white" (quasi) noise.

Figure 2:
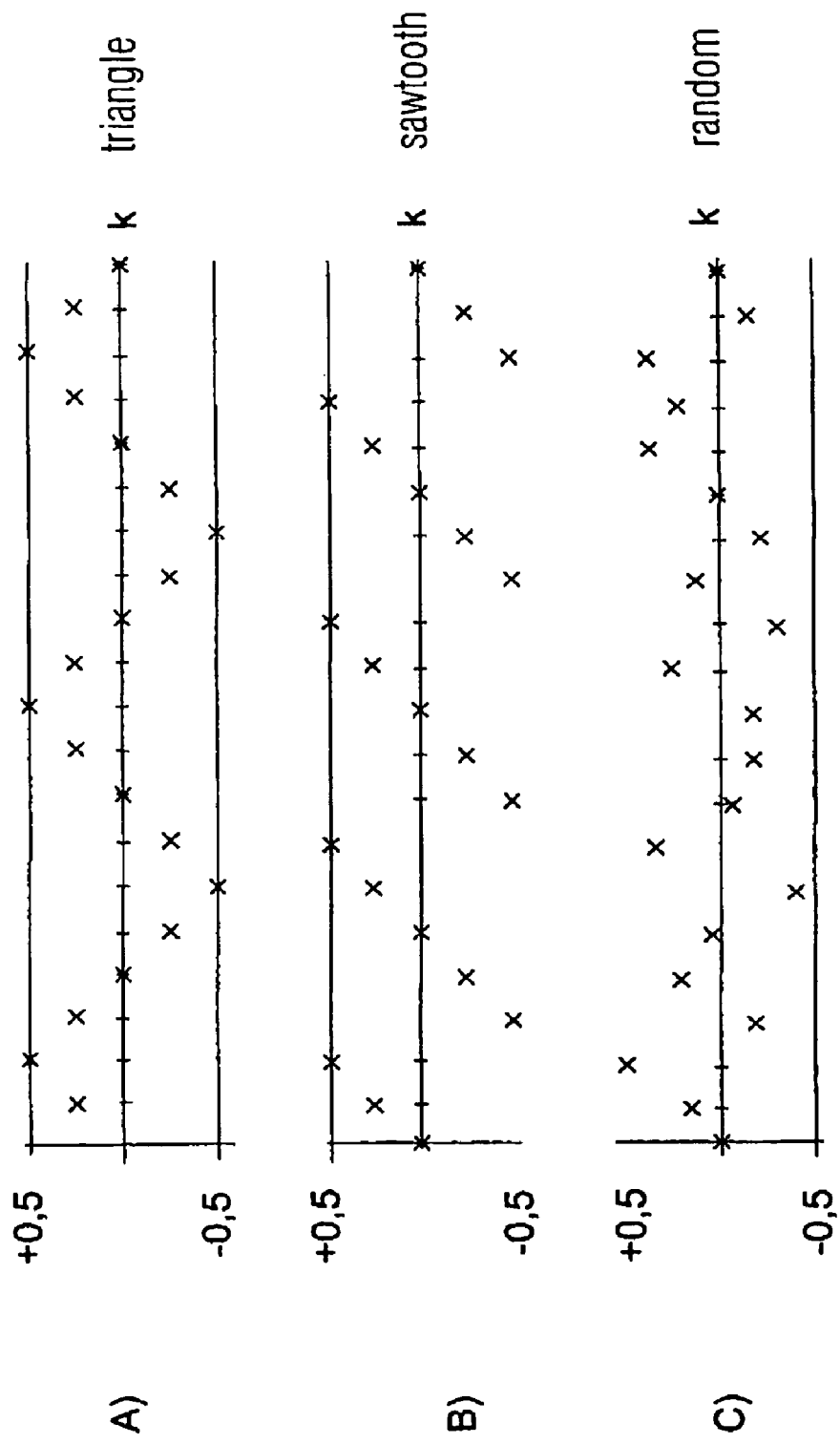
FIGS. 2A to C show examples for a time-discrete modulation function g(k)

In this embodiment, for the input frequency of the phase locked loop arrangement, the following holds true:

$$f_{xpllin(t)} = f_0 + \Box f * g(k)$$

with:

$f_0$=base frequency of the screen (pixel frequency) or base frequency of the memory $\Box f$=frequency range around the base frequency g(k)=time-discrete modulation function k=run index The run index k is increased by 1 each time when a predetermined condition for a frequency change is fulfilled, such as a line or a frame change or something similar occurs, which means a new line and a new frame, respectively, is reached. In FIG. 2A to C, examples for the time discrete modulation frequency g(k) are illustrated, wherein, however, it should be noted here that there is generally no restriction with regard to the discrete function to be used.

Like in the above described first embodiment, with an appropriate choice of the function g(k), the modulation condition and the parameter $\Box f$, the result is a "white" (quasi) noise, which is, in the best case, not or only very faintly visible.

With regard to the above described embodiments, it should be noted in general that both described methods for generating the time-dependent frequency modulation can be used extremely flexible by an appropriate determination of the modulation condition, to enable an adaption of the inventive method to different environmental conditions, which is required due to the plurality of possible input modes and input frequencies.

Figure 8:
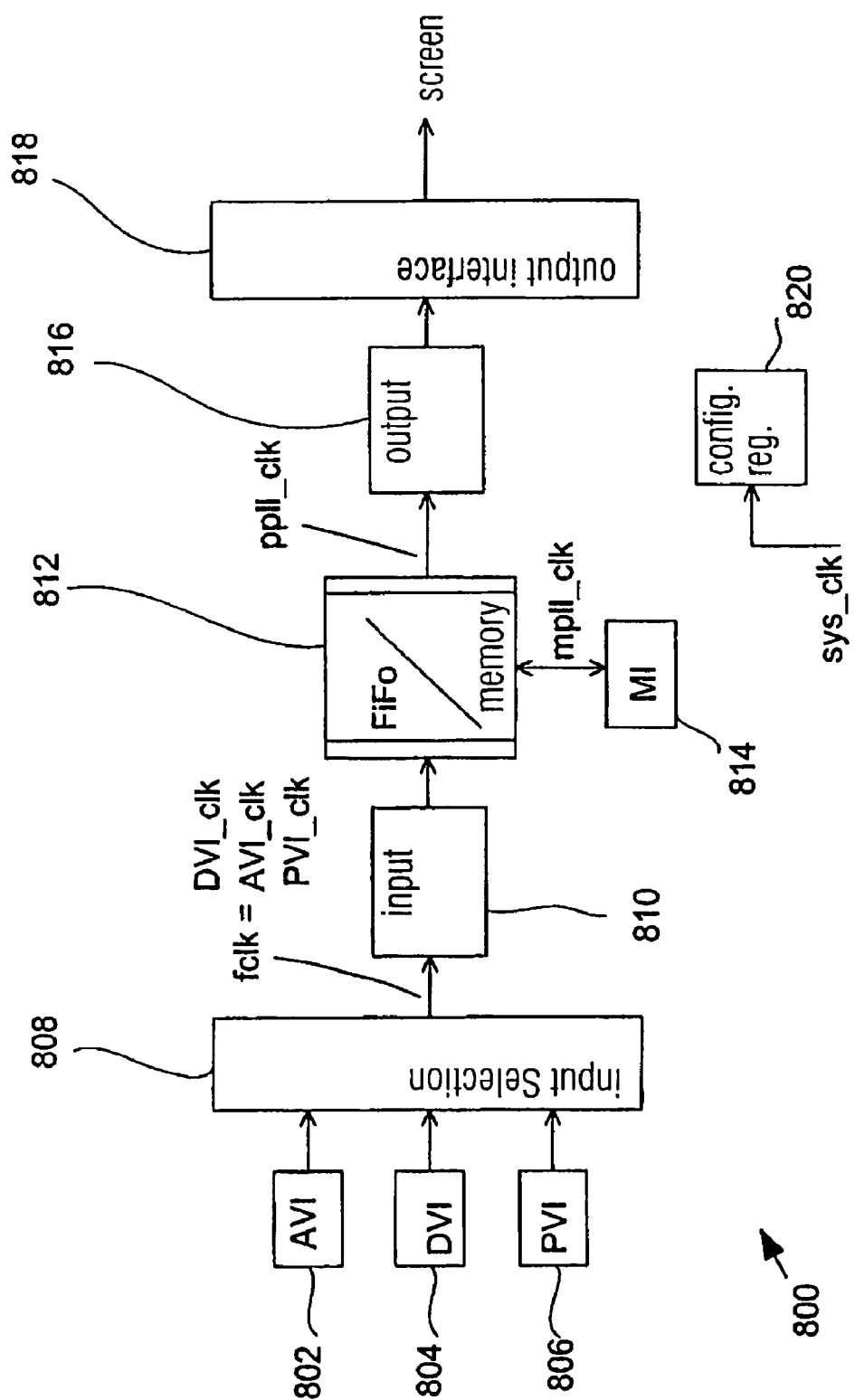
FIG. 8 is a block diagram of a known LCD control unit.
Figure 9:
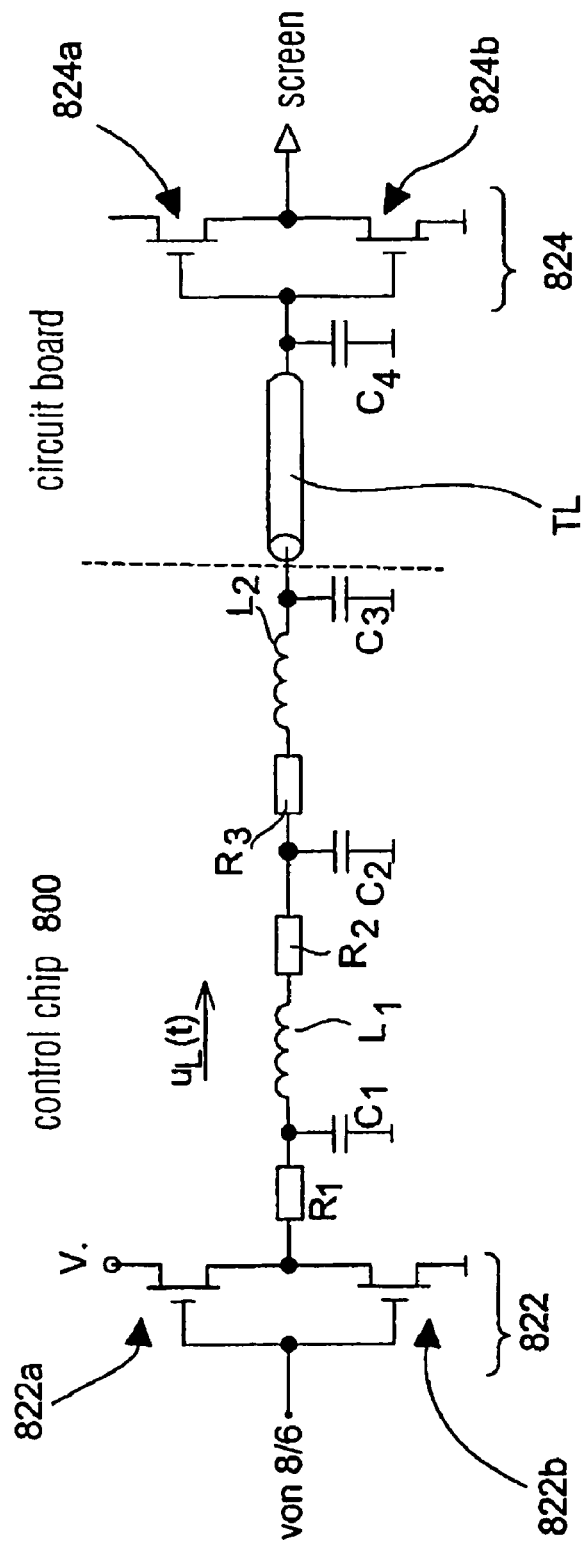
FIG. 9 is an equivalent diagram of the screen interface of the LCD control unit of FIG. 8.
Figure 10:
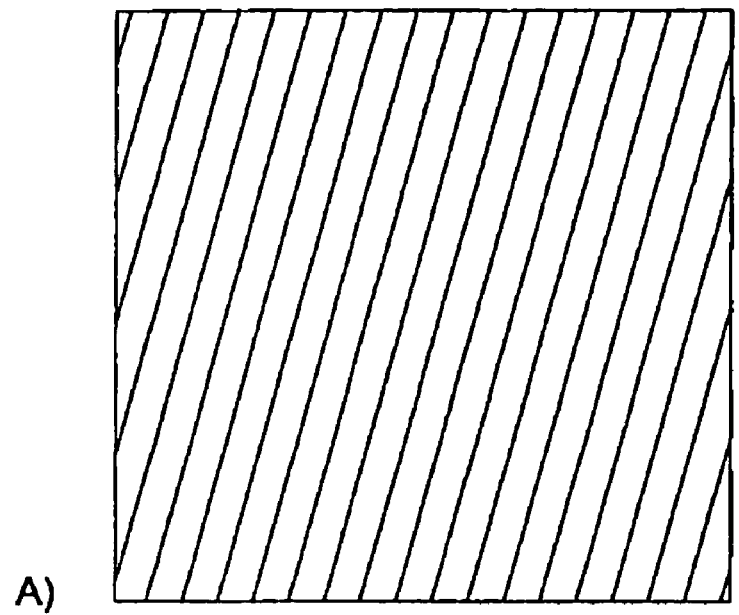
FIG. 10A shows an interference pattern of a LCD control unit with a screen interface.
FIG. 10B shows an interference pattern of a LCD control unit with a screen interface and a memory interface.
Figure 10:
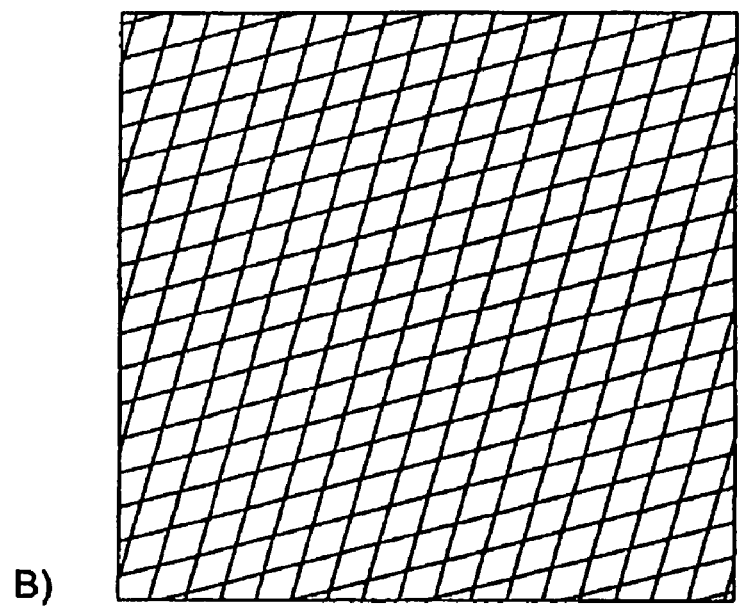
Figure 11:
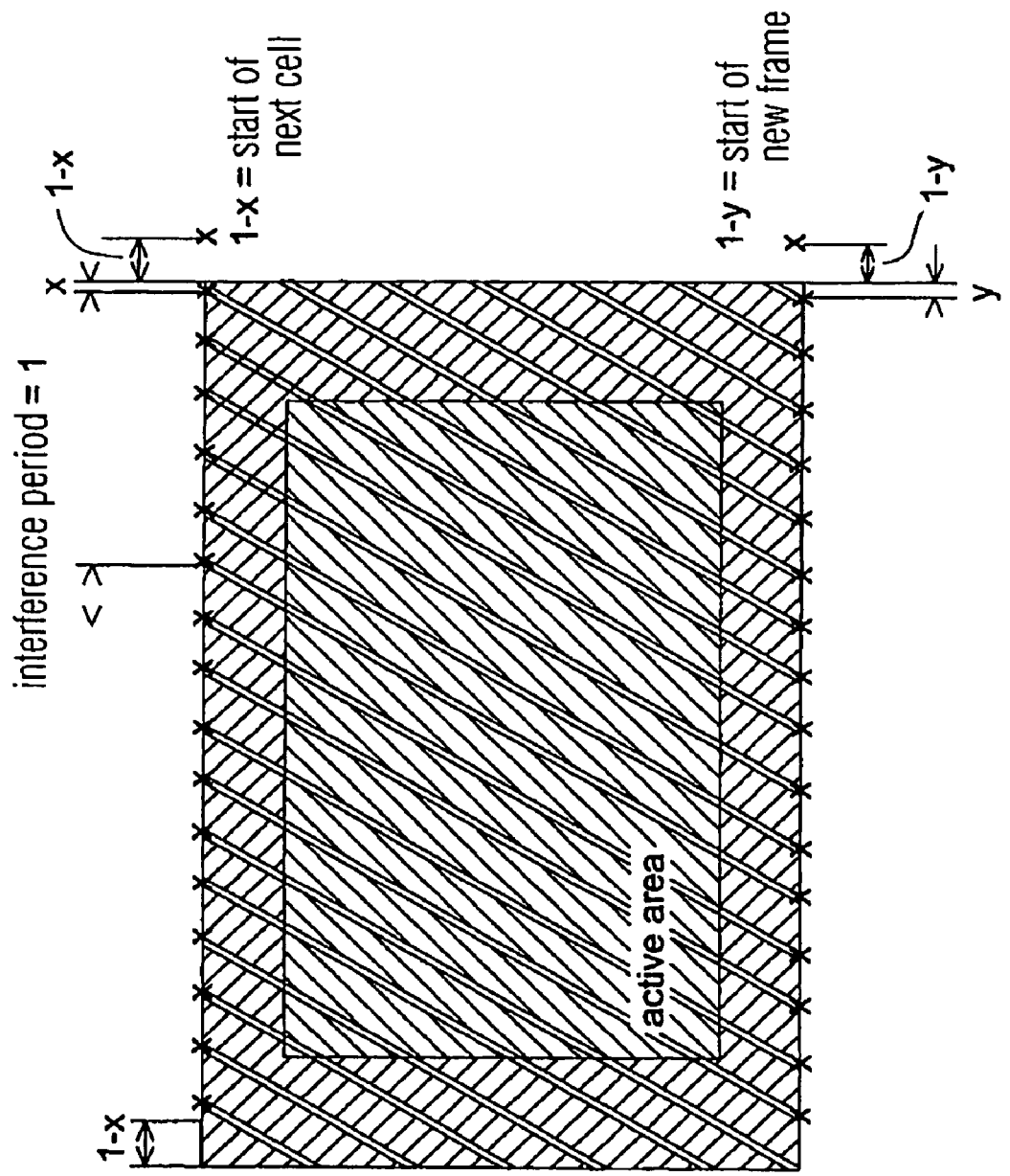
FIG. 11 is an illustration for explaining the formation of an interference pattern.

In the following, the generation and distribution of clock signals on a control chip, such as it is described with regard to FIG. 8, is explained in more detail, and subsequently, based on this discussion, the description of embodiments for implementing the inventive method in control chips for LCD screens follows.

Figure 3:
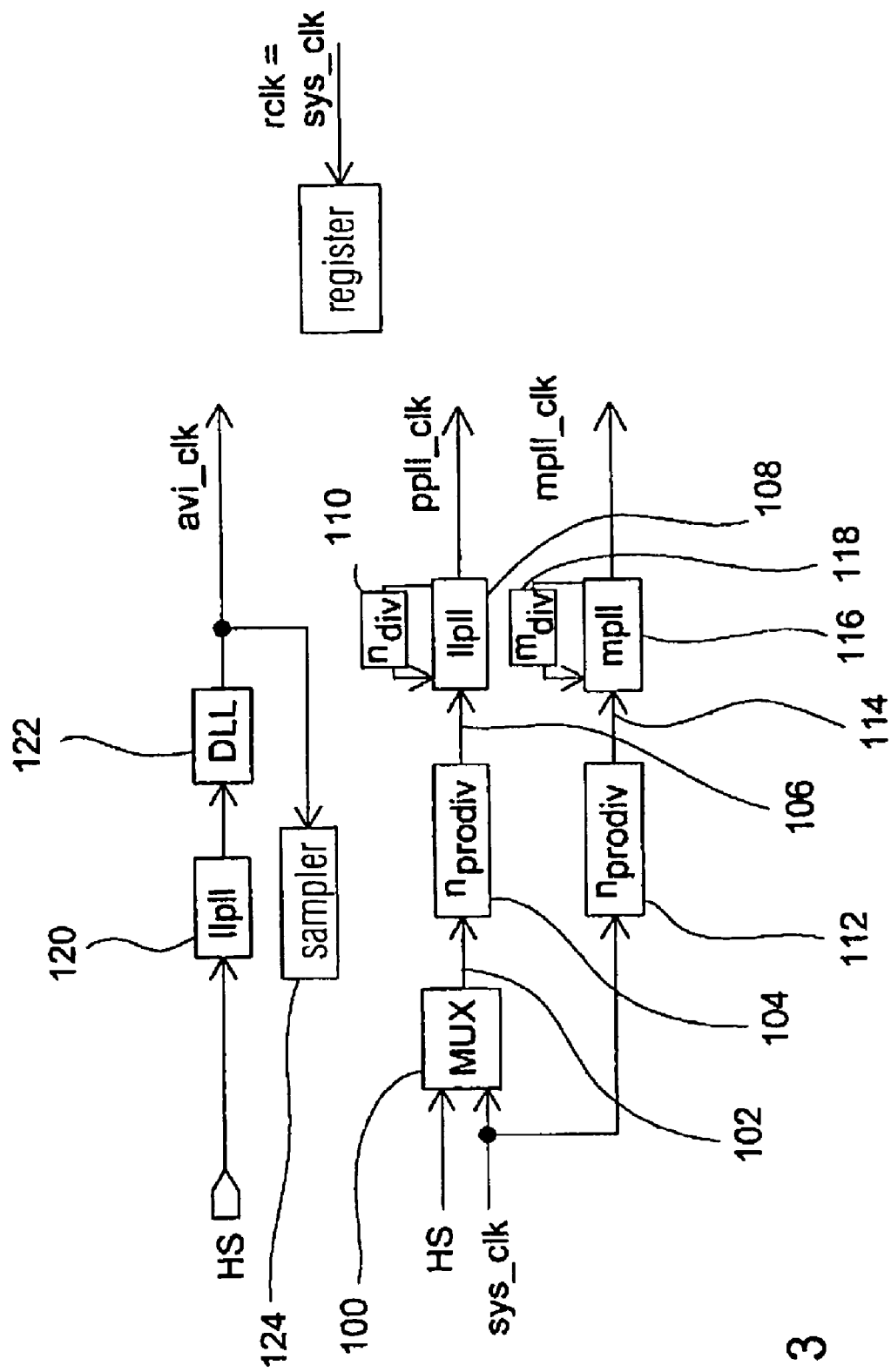
FIG. 3 is a block diagram, which illustrates the clock generation in a control chip for a screen.

In FIG. 3, a block diagram of the units required for the clock generation on a control chip is illustrated. As can be seen in the schematic illustration of FIG. 3, the switching elements shown there are used for generating the memory clock mpll_clk as well as the pixel clock ppll_clk. The circuit comprises a multiplexer 100, which receives a horizontal synchronization signal HS (H-Sync) at a first input. At a second input, the multiplexer 100 receives an external Oscillator clock sys_clk. Based on a driving signal, the multiplexer selects one of the two inputs as input signal for generating the pixel clock ppll_clk. The output signal selected by the multiplexer 100 is provided to a pre-divider 104 ($n_{prediv}$) via line 102, wherein an output signal generated by it is provided to the input of a phase locked loop 108 via another line 106, which provides the pixel clock ppll_clk at the output under the control of an internal divider 110 ($n_{div}$). Further, the external oscillator clock sys_clk is provided to another pre-divider 112 ($n_{pre-div}$), which outputs an output signal to the phase locked loop 116 via line 114 at its output. The phase locked loop 116 is driven by an internal control 118 ($n_{div}$) and outputs the memory clock mpll_clk at the output.

Further, it is indicated in FIG. 3 that the clock for operating the register, the configuration register shown in FIG. 8, rclk is equal to the system clock or external oscillator clock sys_clk.

Further, it is illustrated that the input clock avi_clk is generated from the horizontal synchronization signal HS via a further phase locked loop 120 and a downstream phase delay loop 122, which is also provided to a sampler 124 for the acquisition and digital conversion of the AVI signal.

The schematic circuit diagram illustrated in FIG. 3 is a control unit for clock generation for a LCD control chip with external memory, which normally has at least four different clocks (clock domains), which are in a certain time variant relation to one another. Further, with regard to FIG. 3, a configuration for the clock generation is shown, which can also be found in later implementations and applications.

In FIG. 3, the four clocks and their generation are outlined, and apart from the phase locked loop 108 (llpll), which can use the horizontal synchronization signal HS of the analog video input AV1 as input signal, all other phase locked loops are driven by the external oscillator clock sys_clk.

The clock rclk used for the register of the control chip 800 is uncritical. It is normally identical with the external clock (rclk=sys_clk) and has no visible or measurable influence on the analog circuits of the chip since the registers are static in normal operation.

The case is different for the memory clock mpll_clk and the screen clock (pixel clock) ppll_clk, which are generated from the associated phase locked loops 108 and 116 (ppll, mpll). Via these clock signals, not only very large digital blocks of the LCD control chip are clocked, but also the respective input/output interfaces, namely the memory interface and the screen interface. The external oscillator clock can be used as input signal in both phase locked loops, and by programming the pre-dividers 104, 112 and the internal loop dividers 110, 118, the desired frequency of the clock signal can be set at the output. In the screen phase locked loop the H-Sync signal of the selected input, in the illustrated embodiment the signal HS of the analog video input, can be used as input signal as alternative to the external clock sys_clk.

Starting from the system architecture illustrated in FIG. 3, two preferred embodiments for implementing the above-described method for quasi decorrelation of the clocks will be described below. It will be obvious for a person skilled in the art from the below described implementation that other implementations are also possible.

Figure 4:
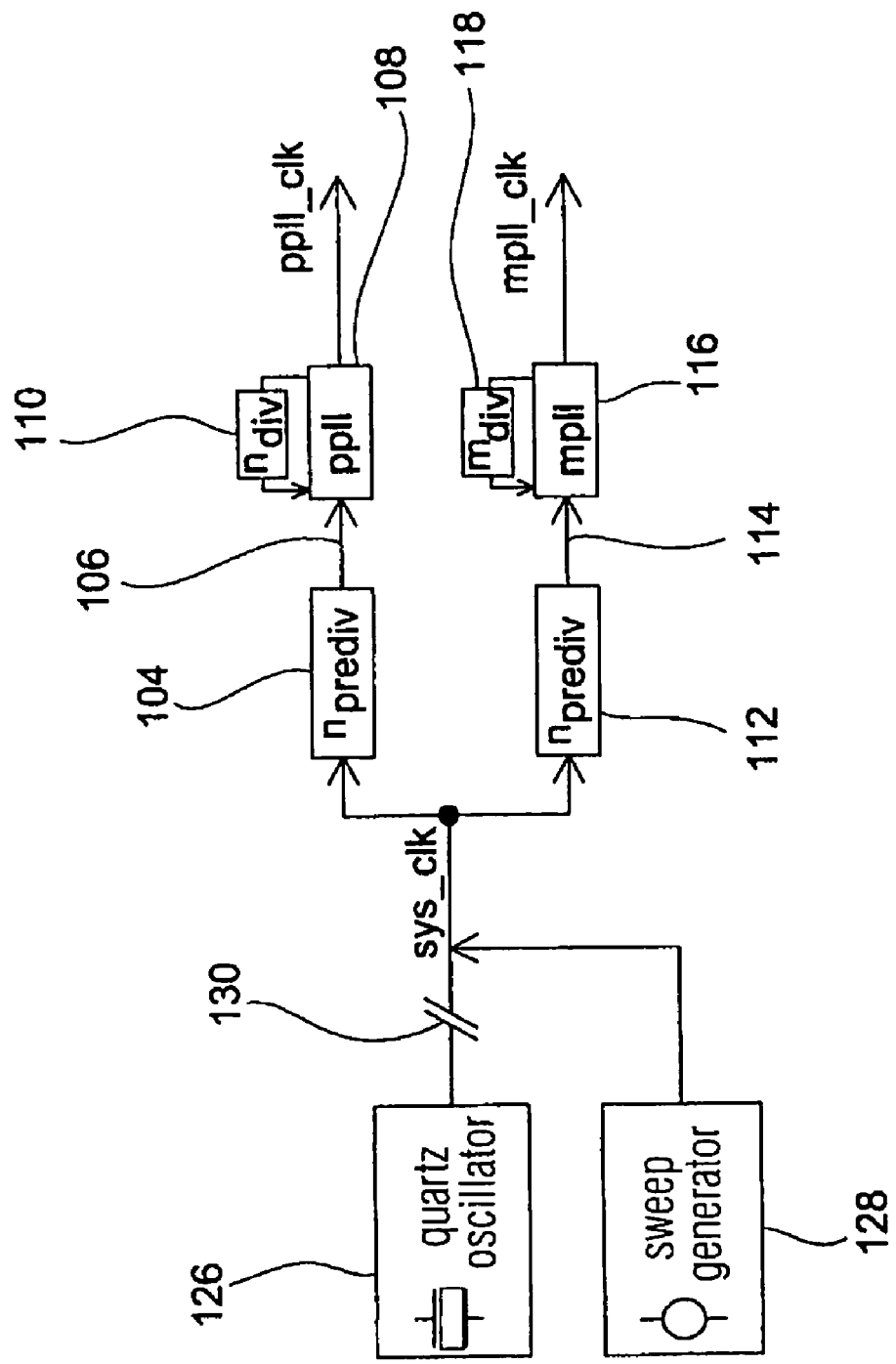
FIG. 4 is a block diagram of a control unit according to a first embodiment of the present invention with external frequency modulation.

With regard to FIG. 3, a first embodiment is described, where the frequency modulated system clock is fed in by an external source. In FIG. 4, a portion of the circuit elements shown in FIG. 3 for generating the pixel clock ppll_clk and the memory clock mpll_clk is illustrated, wherein for implementing the method the externally fed-in system clock sys_clk is selected as input signal to the phase locked loop 108 for generating the pixel clock, so that for simplicity reasons, the multiplexer 100 shown in FIG. 3 is omitted in FIG. 4.

In FIG. 4 it can be seen that instead of the external quartz or crystal oscillator 126 used in conventional LCD control chips, a sweep generator 126 is now used to provide the system clock sys_clk. This is shown by the broken connection between the quasi oscillator 126 and the pre-dividers 104 and 112 ($n_{pre-div}$) in 130. The embodiment illustrated in FIG. 4 is a simple implementation of the present invention, wherein here, instead of the normally used quartz oscillator 126, an external frequency generator 128, such as of the type Stanford DG 245 is used, which is disposed on the printed circuit board instead of the quartz oscillator, where also the control chip for driving the screen is disposed. If the frequency generator 128 is set to generate a frequency modulated signal corresponding to the above-described embodiments of the inventive method, then this frequency modulated output signal of the generator 128 can be used as input signal and system clock sys_clk for the phase locked loops 108 and 116, respectively. With careful selection of the parameters, a quasi decorrelation of the clock signals ppl_clk and mpll_clk generated by the phase locked loops 108 and 116 (ppll, mpll) is achieved in relation to the sample clock of the analog input signal (avi_clk).

The systematical boundaries of the parameters to be selected depend, on the one hand, on the dynamic phase properties of the phase locked loops 108 and 116, and, on the other hand, on the frequency tolerance of the connected units, which means the connected screen and memory. This means that even in a maximum frequency deviation due to the frequency modulation, a safe data transfer to the connected units still has to be ensured. Above that, in a strong frequency modulation, the control of the limits applied to the synthesis of the digital blocks has to be considered to avoid timing problems within the blocks and particularly also at the interfaces between the clocks (clock domains).

The determination of the parameters to be selected for the frequency modulation is very expensive in a theoretical way, since, in reality, not only the base frequencies but all harmonic portions as well as the dynamic properties of all components overlay and lead to a complex time and frequency behavior. Although they can be determined theoretically, the parameters for the frequency modulation are preferably determined empirically for every combination of input mode/application. Based on the values determined in that way, a setting is made according to a wanted mode.

Although the just described embodiment provides good results with the external frequency generator, it is a disadvantage of this embodiment that the costs and the effort for connecting the external frequency generator are too high. For a later application, the usage of an external frequency generator is not wanted, so that in a realization, a simplified programmable/initializable generator on the printed circuit board can be used, which represents a possible but also uneconomical solution.

Figure 5:
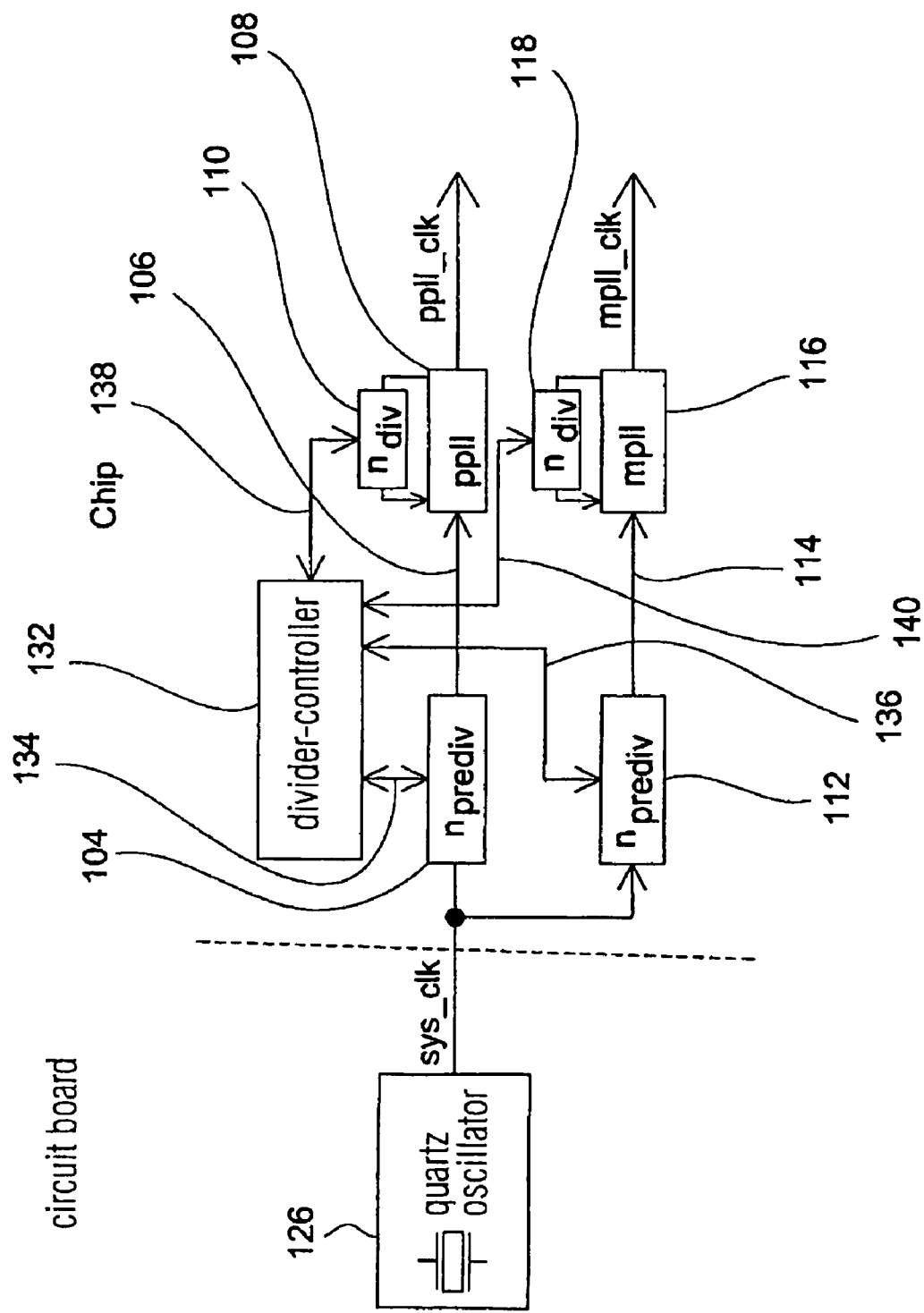
FIG. 5 shows a control unit according to a second embodiment of the present invention with internal frequency modulation.

Thus, according to a second embodiment of the present invention for implementing the inventive method, the frequency modulated system clock is generated internally, i.e., in the control unit, namely on the chip. In FIG. 5, a circuit is illustrated for the internal generation of the frequency modulation. As can be seen, the conventionally used external quartz oscillator 126, which is disposed on the circuit board, is maintained to provide the system clock sys_clk to the control chip. Additionally to the already above-described elements, a divider controller 132 is provided, which is connected to the first pre-divider 104 via a first control bus 134, to the second pre-divider 112 via a second control bus 136, to the first feedback divider 110 via a third control bus 138 and to the second feedback divider 118 via a fourth control bus 140.

The realization illustrated in FIG. 5 is an implementation of the decorrelation by an "on chip" frequency modulation, which is more elegant and technically much easier to realize compared to the realization described with regard to FIG. 4. The starting points for the frequency modulation underlying this embodiment are the pre-dividers 104 and 112 used in the phase locked loops 108 and 116 respectively, as well as the feedback dividers 110 and 118. The divider value of each one of the pre-dividers 104 and 112 and the feedback divider is varied under the control of the driver control 132 via an appropriate algorithm or a programmable pseudo random generator to obtain the above-described time and frequency behavior. In the embodiment illustrated in FIG. 5, the divider control 132 contains a sample control, a programmable counter/divider as well as a random generator.

For the result of the frequency modulation, the precision of the pre-dividers 104, 112 ($n_{pre-div}$) is important, wherein it should be noted that the smallest frequency step $\Box f_{step}$ to be set thereby is transformed upwards by the feedback divider 110, 118 ($n_{div}$) of the phase locked loop 108, 116. For the quantity of the effectively to be obtained frequency step in the pixel clock ppll_clk and the memory clock mpll_clk respectively, the following holds true with the same structure of the circuits:

$$\Box f_{step} = \Box f_n * n_{div}/n_{prediv},$$

wherein, for example, the following holds true:

$$n_{div} = 2^0$$

$$n_{prediv} = 2^{16},$$

wherefrom the minimum $\Box f_{step}$ results.

One problem with the variation of the frequency dividers is the fact that, in principle, they are counters, which are programmed to a certain end value and provide an output pulse when reaching this end value (threshold). Thus, a reprogramming and thus a modulation of the input frequency of the phase locked loops can only take place when the counter overflows. Due to the dynamic behavior of the phase locked loops, a more or less time-continuous change of the output clock signals and the output frequencies mpll_clk, ppll_clk, respectively, occurs. For that reason, it is also not necessary to realize a high resolution in the step widths $\Box f_{step}$, since the intermediate ranges are passed through by the phase locked loops continuously anyway.

The realization of the second embodiment for implementing the inventive method is much easier than with the frequency modulated signal is generated externally, but the time behavior of the phase locked loop is also the deciding factor here. Since the pre-dividers are already present in existing circuits and designs, the inventive method can be implemented and verified with little effort (divider logic and control).

A third preferred embodiment for implementing the frequency modulation required for the decorrelation is the usage of an alternative phase locked loop concept. So-called spread spectrum phase locked loops are used in similar applications for improving the EMC/DMI (EMC=Electromagnetic Compatibility, EMI=Minimisation). By an appropriate adaption of the parameters of the phase locked loops and their control (linear, function or random), it is possible to obtain both decorrelation of the clocks, wherefrom no visible interferences occur, as well as to influence the EMC/EMI behavior positively.

Figure 6:
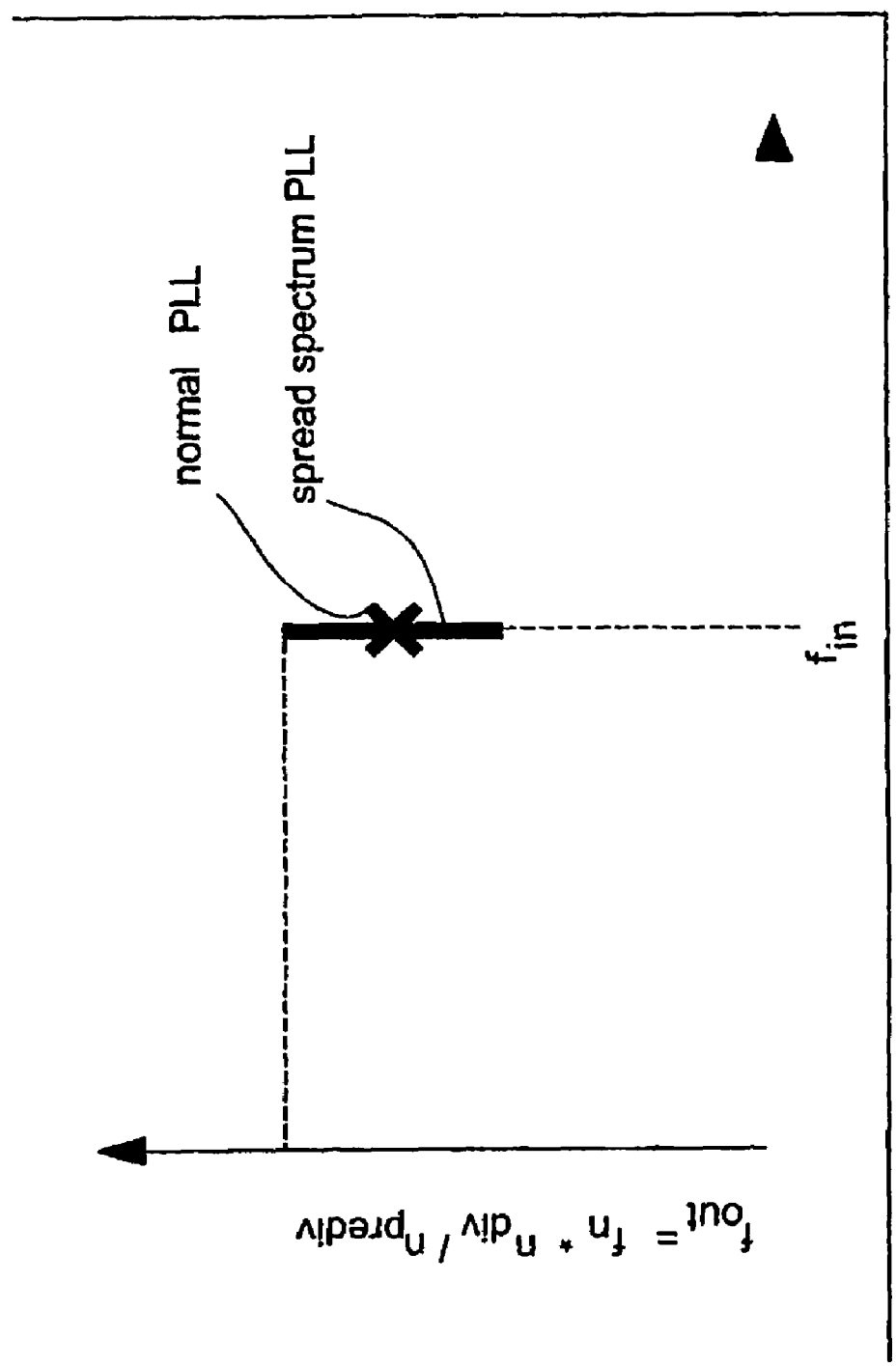
FIG. 6 shows the frequency response in a spread spectrum phase locked loop.

In FIG. 6, the difference between a normal phase locked loop (normal PLL) and a spread spectrum phase locked loop (spread spectrum PLL) is illustrated. As can be seen, the spread spectrum PLL generates, in contrast to the normal PLL, output signals across a pre-determined frequency range, whereas the normal PLL provides merely a single output frequency depending on the input frequency. Thus, the inventive methods for decorrelation of the clock signals described above in more detail can be realized here as well.

Below, experimental results for decorrelating the clock signals are described in more detail, wherein they have been performed based on the above-described first embodiment for implementing the method via an external feeding of the frequency-modulated signals.

For the analysis of occurring interferences in a LCD control unit, particularly such control units, such as SAA 6714, with the possibility to store data in a memory and thus evaluate them statistically are suited. Thus, in the following a respective test installation is described first, and afterwards the results of the decorrelation, obtained therefrom, with external feeding of the frequency modulated system clock are illustrated.

The test installation comprised the following devices and components:

Stanford Research Systems Synthesized Function Generator, Model DS345 as System Clock Generator, Quantum Data Video Test Generator, Model 801 GD as AVI Signal Source, SAA6714 Evaluation Board "Early Dragon", Version 1.2, with SAA6714A, LG Philips Panel, 18 inches, Model LM181E1, SXGA resolution, Deutronic Power Supply 12 V/5 A, Model DTP60

The following settings and parameters were selected:

| Quantum Data Testgenerator | |
|---|---|
| Input: | |
| Format | :83 = DMT1260 |
| Image | :43 = 45Flat27 |
| Resolution | :1280 × 1024 |
| Clock generation: | |
| Stanford Research Systems Synthesized Function Generator: | |
| Base frequency | :25,000,005.000 Hz (25.000005 MHz) |

Due to the possibility of setting the frequency at the Stanford Research Generator in Hz-steps, the special case of a standing interference pattern could be generated, which could then be evaluated statistically—even without caching in the memory. If the system clock is generated by a quartz oscillator during normal operation, the generation and the type of interference lines depend strongly on the temperature of the quartz oscillator as well as its aging, production tolerances, etc.

The behavior of a LCD control, as it was described with regard to FIG. 8, was tested. Here, the output of the external frequency generator serves as reference signal for the memory clock and the screen clock (pixel clock), as it has been described above. A frequency modulation at the external generator leads to a frequency modulation of the memory clock and the stream clock, respectively, which is determined by the dynamic behavior of the respective phase locked loop.

Figure 7:
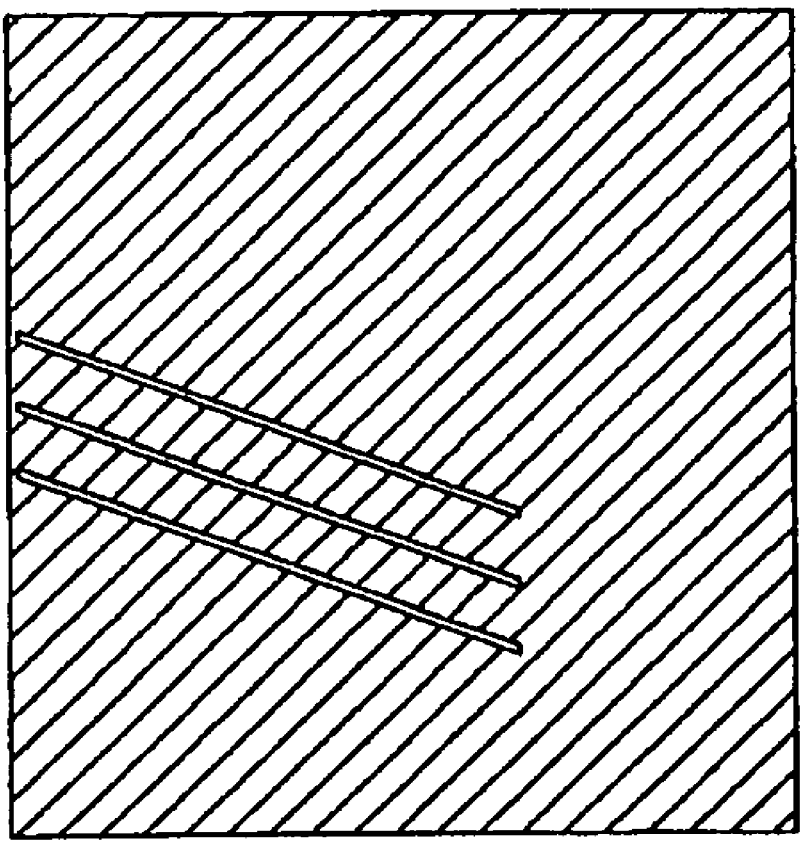
FIG. 7 shows an example for an interference pattern in a LCD control unit with memory and screen interface.

FIG. 7 shows a portion of a screen print out, which has been established by freezing the picture in the external memory of the LCD scaler and by reading out this memory area. Since the interference lines are hardly visible in the printout of the document, three of them have been highlighted by white lines for illustration purposes.

In contrary to the already described discrete model, in reality a strong dependency of the interference pattern shows even in small frequency changes. With a change of the input frequency by only several Hertz, different interference patterns become visible.

In the following table, some settings as well as the respective forms of the interference lines are shown.

| Frequency(Hz) | Interference lines |
| --- | --- |
| 25,000,004 | about 20 degree slope clockwise with a distance of about 5 mm |
| 25,000,010 | about 20 degree slope clockwise with a distance of about 3 mm |
| 25,000,012 | about 150 degree slope clockwise with a distance of about 2 mm |
| 25,000,018 | about 20 degree slope clockwise with a distance of about 5 mm |
| 25,000,025 | like in 25,000,012 and 25,000,010 together |

By using the decorrelation via a frequency modulated system clock instead of the quartz oscillator on the printed circuit board, it is possible to make the interference patterns illustrated in FIG. 7 "invisible" for the human eye. A deciding factor for the desired effect is thereby the combination of interference frequency, diversion of interference lines by frequency modulation and vertical refresh rate.

As an example, the interference pattern is to be considered, which occurred at 25,000,004 Hz system clock. A sweep rate of 25 Hz, a swept frequency range of 7777 Hz, as well as a sinus function as modulation frequency g(t) was selected, and with these settings at the function generator a very good result was achieved, where the interference lines were no longer visible for the human eye.

Preferably, the inventive method is performed by using a random modulation, since there is the possibility that by the frequency modulation itself a new and in its occurrence complex interference pattern will be generated. Since this behavior is mainly to be expected in continuous modulation functions, it follows from the simulation results with discrete model that the random modulation is the more favorable variation of the frequency modulation.

The inventive method has shown both in the model and in reality that interference occurrences in LCD control units can effectively be alleviated and made invisible, respectively, by the described quasi decorrelation of the clock signals.

The technical realization is possible with relatively low effort, but for the effective usage of the method the suitable parameters are to be established for different modi to make sure that the method works reliably and that there are no problems with the external components (memory and screen).

Above, a preferred embodiment of the present invention has been described in more detail, where the visible interferences have been achieved by changing the pixel frequency when generating the pixel data. However, the present invention is not limited thereto.

Generally, all interfering signals on the chip of the second board can be manipulated in the same way as the signals ppll and mpll, so that the present invention is not limited to these clock signals, but can be applied generally to all clock signals.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for reducing interference patterns in the display of an image on a screen with a pixel frequency, wherein the image can be described by pixel data, which are provided to the screen by a control unit based on received image data, wherein the control unit has an input for receiving the image data and a plurality of clock signals, wherein one or more of the clock signals couples into the control unit via the input and overlays the image data, the method comprising:

during the generation of pixel data, varying one or several of the clock signals used in generating the pixel data by time-dependent frequency modulation, wherein the time-dependent frequency modulation is time-discrete over a row or a frame of the pixel data, and the frequency is changed in a change of rows or a change of frames.

2. The method according to claim 1, wherein during the generation of the pixel data the pixel frequency is changed.

3. The method according to claim 1, wherein the control unit comprises a pixel frequency generator, which generates the pixel frequency depending on an applied input frequency, wherein the step of changing the pixel frequency comprises changing the input frequency.

4. The method according to claim 3, wherein the input frequency is provided by an external frequency source or by an internal frequency source of the control unit.

5. The method according to claim 3, wherein the control unit comprises a memory interface, which is driven by a driving signal with a memory frequency, and a memory frequency generator, wherein the input frequency of the pixel frequency generator is further applied to the memory frequency generator.

6. The method according to claim 3, wherein the pixel frequency generator comprises a spread spectrum phase locked loop.

7. A control unit for controlling a screen, which operates at a pixel frequency, for the display of an image on the screen with reduced interference pattern, wherein the control unit comprises a plurality of clock signals, comprising an input for receiving image data, wherein one or more of the clock signals couples into the control unit via the input and is overlaid with the image data;

a processor, which processes the received image data for generating the pixel data, wherein the processor varies one or several of the clock signals used in generating the pixel data during the generation of the pixel data by time-dependent frequency modulation; and an output for providing the pixel data for the display, wherein the time-dependent frequency modulation is time-discrete over a row or a frame of the pixel data, and wherein the processor causes a change of the frequency in a change of rows or a change of frames.

8. The control unit according to claim 7, wherein the processor changes the pixel frequency during the generation of the pixel data.

9. the control unit according to claim 7, wherein the processor comprises a pixel frequency generator, which generates the pixel frequency depending on a changing input frequency signal.

10. The control unit according to claim 9, wherein the variable input frequency signal is provided by an external signal source or by an internal frequency control based on an external constant frequency signal.

11. The control unit according to claim 9, wherein the processing unit comprises a memory frequency generator, which generates a memory frequency for a driving signal for a memory interface, based on the input frequency signal.

12. The control unit according to claim 9, wherein the pixel frequency generator comprises a spread spectrum phase locked loop.

* * * * *